US006608331B2

United States Patent
Duineveld

(10) Patent No.: US 6,608,331 B2
(45) Date of Patent: Aug. 19, 2003

(54) ASSEMBLY FOR A THIN-FILM OPTICAL DEVICE, ORGANIC ELECTROLUMINESCENT DISPLAY DEVICE AND METHOD OF MANUFACTURING SAME

(75) Inventor: Paulus Cornelis Duineveld, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/247,928

(22) Filed: Sep. 20, 2002

(65) Prior Publication Data

US 2003/0057492 A1 Mar. 27, 2003

(30) Foreign Application Priority Data

Sep. 24, 2001 (EP) ............................................. 01203608

(51) Int. Cl.⁷ .......................... H01L 33/00; H01L 29/04; H01L 31/20; H01L 27/01; H01L 27/12

(52) U.S. Cl. ............................. 257/93; 257/59; 257/72; 257/350

(58) Field of Search ............................. 257/59, 72, 88, 257/89, 93, 350

(56) References Cited

U.S. PATENT DOCUMENTS

| 6,236,065 B1 | * | 5/2001 | Kurahashi et al. ............. 257/93 |
| 2002/0125490 A1 | * | 9/2002 | Chuman et al. ............... 257/93 |
| 2003/0044639 A1 | * | 3/2003 | Fukuda ........................ 428/690 |

FOREIGN PATENT DOCUMENTS

| EP | 0732868 B1 | 9/1996 | ........... H05B/33/12 |
| EP | 0989778 A1 | 3/2000 | ............. H05B/1/00 |

* cited by examiner

Primary Examiner—Ngân V. Ngô

(57) ABSTRACT

An assembly for a thin-film optical device includes a substrate and a plurality of elongated banks arranged on the substrate and spaced apart to form a plurality of channels for receiving a substance. At least one channel widens locally at at least one position along that channel to define a site for depositing a quantity of the substance.

20 Claims, 3 Drawing Sheets

ASSEMBLY FOR A THIN-FILM OPTICAL DEVICE, ORGANIC ELECTROLUMINESCENT DISPLAY DEVICE AND METHOD OF MANUFACTURING SAME

FIELD OF TECHNOLOGY

BACKGROUND AND SUMMARY

The invention relates to an assembly for a thin-film optical device comprising a substrate and a plurality of elongated banks arranged on the substrate and spaced apart to form a plurality of channels for receiving a substance.

The invention further relates to an organic electroluminescent display device and to a method of manufacturing an electroluminescent display device.

Such an assembly, display device and method are known from, for example, EP 0 989 778 A1, which discloses a substrate for patterning thin film and surface treatment thereof. The banks partition areas on the surface of the substrate, which are to be coated with a substance comprising, for example, an electroluminescent material. To prevent overflow of the substance between adjacent areas, upper surfaces of upper portions of the banks have liquid droplet reservoir structures. The banks must therefore be wide enough to accommodate such reservoirs, which must have a large enough cross-section to absorb all of the spillover between the areas. The banks detract space from the area available for channels that could otherwise be filled with an organic electroluminescent compound to create the pixels of the display device. This is especially problematic when adjacent channels are to be filled with compounds emitting light of a different colour, and a high resolution of the image displayed is to be achieved.

It is an object of the present invention to provide an alternative assembly, display device and method of manufacturing a display device of the type mentioned above.

Accordingly, the assembly according to the invention is characterised in that at least one channel widens locally at at least one position along that channel to define a site for depositing a quantity of the substance. The method according to the invention is characterised by selecting an assembly according to any one of claims 1–5, and depositing one or more quantities of a substance comprising an organic electroluminescent material only at deposition sites along a channel.

Thus, it is possible to use closely spaced channels with a small width relative to the droplet diameter to achieve a high resolution of the image displayed. Because the quantities are deposited as droplets only at sites where the channel is wider, spillover between adjacent channels is prevented.

In a preferred embodiment of the assembly according to the invention, each channel widens locally at a plurality of positions along that channel to define a plurality of sites for depositing quantities of the substance. Thus, it is possible to deposit different optical substances in different channels to create a multi-colour display device, without any mixing occurring between the different substances.

In a preferred variant of this embodiment, parallel deposition sites of adjacent channels are staggered relative to each other. Thus, the total width of adjacent channels in a multi-colour display manufactured from the assembly can be kept small so as to achieve a high resolution.

In a preferred embodiment of the assembly according to the invention, facing sides of the banks forming a channel have a section at least partially overhanging the channel. Thus, an increased capillary effect causes fluid deposition in droplets at the depositing sites to better fill the channel sections between the deposition sites.

BRIEF DESCRIPTION OF THE DRAWING FIGURES

The invention will now be explained in further detail with reference to the drawings, wherein FIG. 1 shows a perspective view of part of a polymer LED display device, illustrating some important concepts of such devices.

DETAILED DESCRIPTION

Figure 1:
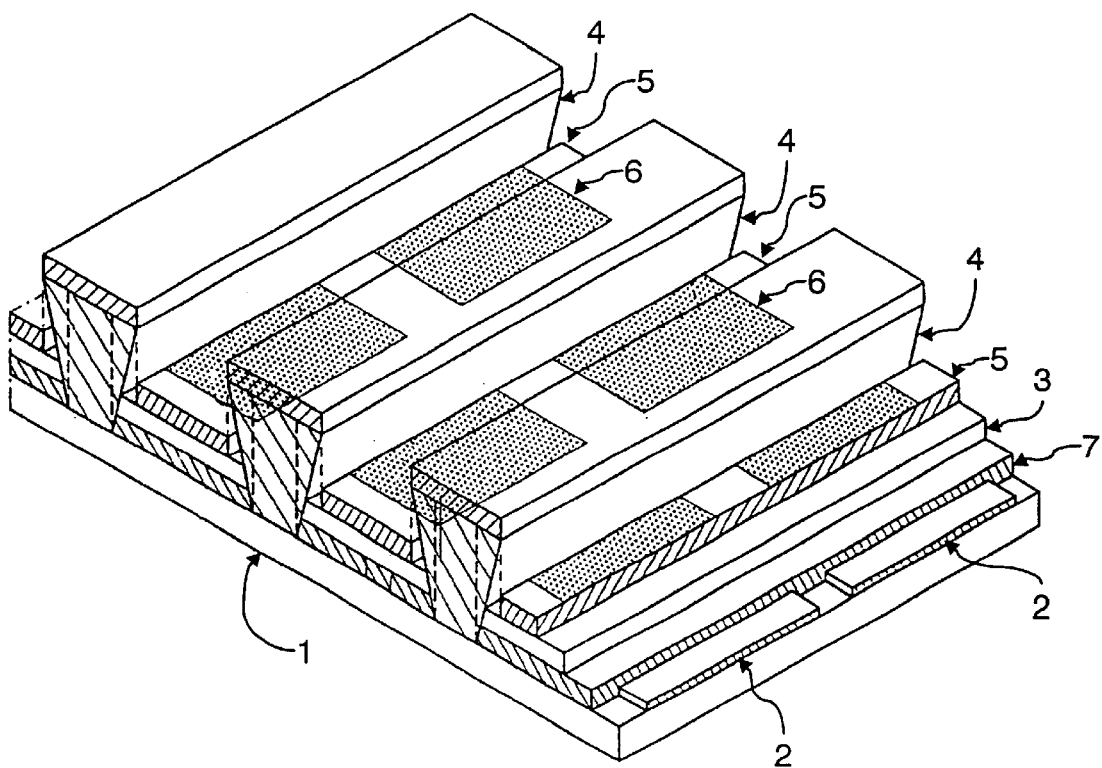

FIG. 1 shows an electroluminescent matrix display device. Such a device can be part of a flat panel display, for instance for a mobile phone, personal digital assistant (PDA), computer monitor, or similar electronic device. Monochrome and colour versions exist. The device comprises a substrate 1. The substrate 1 can, for example, be made of a flexible or rigid transparent synthetic resin, quartz, ceramics or glass. A number of spaced strips of electrically conducting material on the substrate 1 form first electrodes 2. The display device further comprises a layer of electroluminescent material 3, arranged in strips that are separated by banks 4 on the substrate 1. Second electrodes 5 are arranged on top of the layer of electroluminescent material 3. The second electrode strips 5 cross the first electrode strips 2 such that, in operation, an individual light emitting device (pixel) is allocated to the crossing of a first and a second electrode strip.

Preferably, the direction of the first electrodes 2 is substantially perpendicular to the direction of the second electrodes 5. In the example shown in FIG. 1, the first electrodes 2 form the cathodes of the display device, and the second electrodes 5 form the anodes of the display device. When a voltage difference is set up between cathode and anode, carriers, holes and electrons, respectively, drift between cathode and anode. To obtain emission of carriers of the appropriate kind, the anode is suitably made of a metal or alloy with a high work function, such as Au, Pt, Ag. The cathode is suitably made of a metal or alloy with a low work function, such as Yb, Ca, Mg:Ag, Li:Al, Ba, or it can be a laminate of different layers. A very suitable transparent material, predominantly used for the anode, is Indium-Tin-Oxide (ITO). Such electrodes are manufactured using a photolithography process, which allows them to be shaped into specific patterns.

Pixels 6 are defined at the location where first electrodes 2 and second electrodes 5 cross. Electrons and holes drifting between the electrodes under the influence of a voltage difference between a second electrode 5 and a first electrode 2, combine in the layer of electroluminescent material 3, causing light to be emitted. In a passive matrix display, a pixel 6 is addressed by setting up a voltage difference between the appropriate second electrode 5 and first electrode 2. In an active matrix display, a transistor and a capacitor, individually addressing each pixel 6, are provided for each pixel 6.

Pixels 6 of different colour can be used, since the banks 4 divide the layer of electroluminescent material 3 into a number of channels, which can each comprise a different type of electroluminescent material.

The matrix display device of FIG. 1 further comprises a carrier-injection layer 7. With the aid of this layer 7 carriers are injected from the first electrodes 2 into the layer of electroluminescent material 3. Depending on whether the first electrodes 2 form the cathode or the anode, the carrier-injection layer 7 will be enhanced with electrons or holes, respectively, i.e. the carrier-injection layer 7 enhances the injection of electrons and holes respectively. A similar layer, not shown, can be provided between the layer of electroluminescent material 3 and the second electrodes 5.

Organic LED devices can be manufactured by inserting a fluid with an electroluminescent material or a precursor material thereof, as a component, between the banks 4. The fluid can be a solution, dispersion, emulsion or paste. It can, for example, include a soluble polymer that exhibits electroluminescence. After the channels between the banks 4 have been filled with the fluid, the layer of electroluminescent material 3 can be created by evaporation of a solvent or a chemical reaction that results in the electroluminescent material 3, depending on the composition of the fluid.

The present invention focuses on the step in the manufacturing process wherein fluid is deposited between the banks 4. The description will focus on the deposition of the fluid with an electroluminescent material or a precursor material thereof, as a component. It is noted, however, that the carrier injection layer 7 can be deposited in a similar fashion in a separate processing step. Deposition of the fluid between the banks is preferably done by ink-jet printing, wherein drops of the fluid are forced through a nozzle, which is accurately positioned over a channel between two banks. It is also possible to use a pipette, in which case drops are deposited in the channels under the influence of gravitational and/or adhesive forces.

The spacing between the banks 4 directly influences the properties of the display device. If they are spaced in such a way that the channels are very close together, the resolution of the display is enhanced. However, if this means that the channels are narrower, then the size of the pixels 6 is reduced, resulting in lower light emission. In addition to this, it becomes very difficult to deposit drops of an optical substance in the channels, using the above-described techniques, without any of the substance spilling over into adjacent channels.

This trade-off becomes crucial when a colour display device is desired. The channels between the banks 4 will then alternately be filled with different fluids. After processing, each fluid results in a strip of electroluminescent material 3 with different light-emitting properties, notably with a different wavelength of emitted light. The size of the droplets of fluid deposited between the banks 4 also becomes a concern in the design of the pattern formed by the banks 4. Spillover of fluid between the different channels and subsequent mixing must be prevented. Because the droplet size is usually dictated by the equipment used, for example the dimensions of the nozzle used for ink-jet printing, the assembly formed by the banks 4 and the substrate 1 must be suitably designed.

Figure 2:
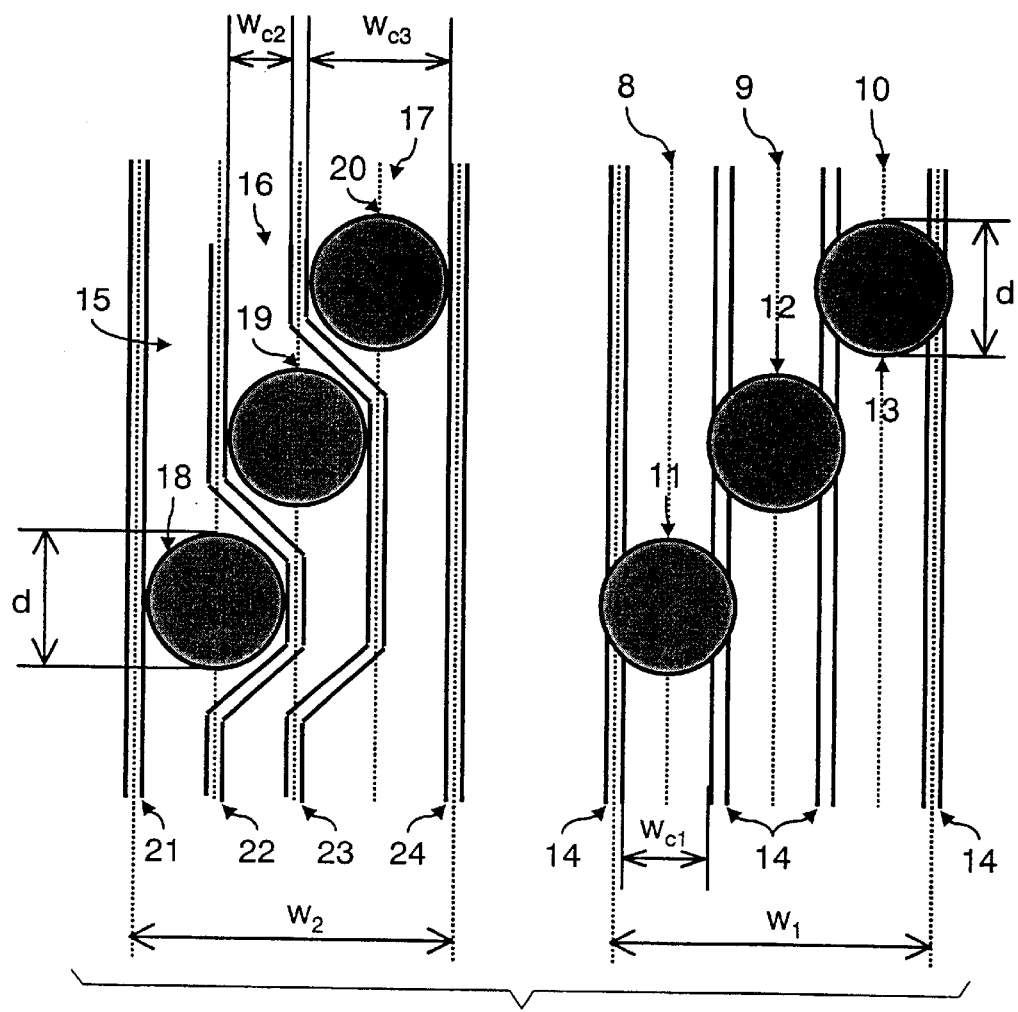
FIG. 2 shows a plan view of an embodiment of the assembly according to the invention next to an assembly known from the prior art.

FIG. 2, shows plan views of two such assemblies. An assembly known from the prior art comprises three channels 8–10. During manufacturing a display device, drops 11–13 are deposited in a continuous stream from one or more nozzles, accurately centred on the channels 8–10 and moved along them in the longitudinal direction. The first drop 11 of fluid can result, for example, in an electroluminescent material emitting red light, the second drop 12 in material for emitting blue light and the third drop 13 in material for emitting green light. The channels 8–10 are formed by banks 14, which are equally spaced, so that each of the channels 8–10 has the same width $w_{c1}$. The widths of the channels 8–10 and the banks 14 separating them add up to a total width $w_1$. The total width $w_1$ determines the resolution that can be achieved with the resulting display device, since three pixels 6, one of each colour, are needed for each point in an image. A smaller width $w_1$ implies a higher resolution. The banks 14 should not be too wide, either, because this detracts from the width $w_{c1}$ of the channels 8–10, and therefore also from the pixel size. The drops 11–13 in FIG. 2 have a diameter d. As can be seen, the value of the width $w_{c1}$ has been chosen to be too small for the diameter d of the drops 11–13.

Typical values for d are in the range of 25–30 μm. A droplet can be placed with an accuracy of the order of 10 μm, so drop placement requires a local width of about 50 μm. A desirable value for the total width $w_1$, in the case of a multi-colour display device, is of the order of 100–200 μm. This implies a channel width $w_{c1}$ of 30–66 μm. Given the obtainable minimum drop diameter and drop placement accuracy, spillover and consequent mixing of fluids is very difficult to prevent using the known assembly.

To the left of the prior art assembly, there is shown an embodiment of an assembly according to the invention. This too comprises three channels 15–17, into which droplets 18–20 are to be deposited during manufacturing a display device. Banks 21–24, arranged so as to be spaced out, define the channels 15–17. The banks 21–24 have the same width as the banks 14 of the known assembly. The total width $w_2$ of the channels 15–17 is equal to the total width $w_1$ of the channels 8–10 and banks 14 of the known device. The width of the channels 15–17 of the assembly according to the invention, however, is not constant along their length. Instead, in the embodiment shown in FIG. 2, it varies between a smaller width $w_{c2}$ and a layer width $w_{c3}$. The channels 15–17 widen locally at certain positions along their length.

Because each of the channels 15–17 widens locally at a plurality of positions along that channel to define a plurality of sites for depositing quantities of the fluids, each of the channels can be filled with a different substance, without any mixing of substances taking place in the channels 15–17. In the embodiment of FIG. 2, the channels 15–17 widen in a quite abrupt fashion, resulting in relatively sharp edges and corners, where the banks 22, 23 deviate from a straight line. It is also possible within the scope of the invention to provide channels that widen more gradually. This can be advantageous, because sharp corners have a tendency to attract more fluid.

As can be seen, the parallel deposition sites of the adjacent channels 15–17 are staggered relative to each other. Thus, even though the channels 15–17 widen locally to $w_{c3}$, the total width remains constant. If the channels 15–17 are alternately filled with substances for emitting red, blue and green light, the distance to a next channel of the same colour will still be small and constant along the length of the channels 15–17. A high resolution can therefore be achieved.

During manufacturing a display device from an assembly according to the invention, nozzles are again accurately centred on the channels 15–17, and moved along them in the longitudinal direction. However, in the manufacturing method according to the present invention, droplets 18–20 are only deposited at the deposition sites defined by their width $w_{c3}$. As can be seen from FIG. 2, this allows the use of droplets 18–20 with the same diameter d as the drops 11–13, yet without any spillover between the channels 15–17.

The use of wider deposition sites has several distinct advantages. Obviously, the resolution that can be achieved with a display device according to the invention is higher than that of the known device, at a given drop diameter d. Their lateral spacing is smaller. Additionally, a matrix display can be so constructed that the first electrodes 2 and second electrodes 5 overlap to form pixels 6 at the deposition sites. Since these sites have an enlarged area, more light can be emitted from a pixel.

It will be apparent that the width of the second electrodes 5 must be chosen to be small enough to keep the electrodes associated with left channel 15 and right channel 17 electrically insulated from the electrode associated with a centre channel 16. However, in a preferred embodiment, the second electrodes 5, running substantially parallel to the channels 15–17, also widen at the deposition sites, in order to further increase the pixel area. This provides even larger pixel sizes, but keeps the second electrodes 5 electrically insulated to ensure that the pixels 6 are individually addressable.

Figure 3:
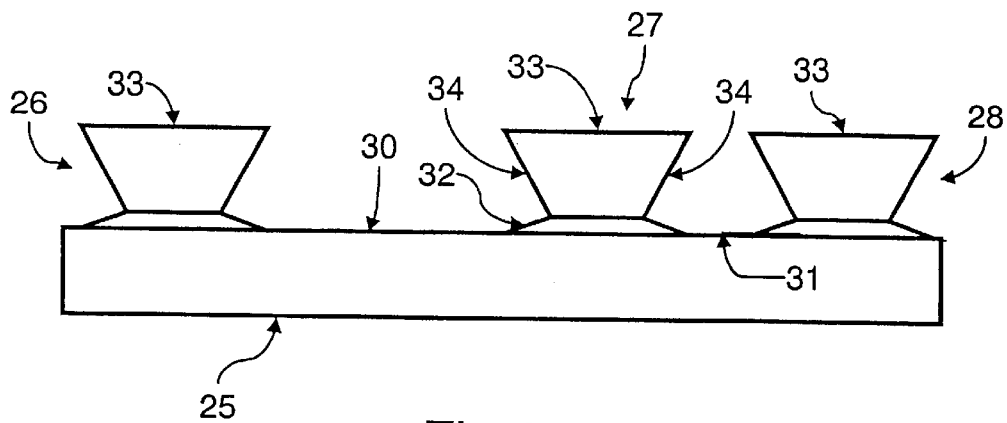
FIG. 3 shows a cross-sectional view of an embodiment of the assembly according to the invention.

FIG. 3 shows a cross-section of an embodiment of the assembly according to the invention. A substrate 25 of a type discussed above is shown. Banks 26–28 define two channels 30, 31. The cross-section is taken at a location along the channels 30, 31, where a site for depositing droplets 18–20 is located in the left channel 30. Consequently, the width of the right-hand channel 31 is smaller there.

The banks 26–28 have been manufactured by applying a layer of photoresist to the substrate 25. The barrier topography has then been determined by projection of light through a mask using a known method. As a result a pattern of photoresist is formed on the substrate, consisting of convex photoresist sections 32. If desired, the pattern can comprise further banks in a position transverse to the banks 26–28, effectively dividing the channels into segments, and creating a checkboard-like configuration. This can be useful if a different configuration of electrodes and channels in a display device is to be achieved, in which the second electrodes are embedded in, or positioned directly on, the substrate, and the first electrodes are located on top of the channels.

To decrease the wettability of the photoresist sections 32, a suitable surface treatment can have been used, such as $CF_4$ plasma. In this way, fluid is less likely to creep up the banks. The banks 26–28, of course, not only form the walls of the channel, but also provide electrical insulation between second electrodes 5 in a display device manufactured from the assembly.

In a preferred embodiment, bank upper sections 33 of a material that bonds to the photoresist sections 32 further make up the banks 26–28. The total height can be in the range of 1–30 µm, more usually 3–8 µm. Typical values for the bank width are in a range of 1–50 µm, preferably between 5 and 20 µm.

The bank upper sections 33 are shaped in such a way that the banks 26–28 forming the channels 30, 31 have a section 34 partially overhanging the channels 30, 31. This provides an increased capillary effect. The fluid deposited in the wider sections of the channels 30, 31 is thus spread more effectively and more quickly along the channels 30, 31, thereby filling up the narrower sections. Thus, referring to the cross-section of FIG. 3, the displayed section of channel 30 is filled directly by one or more droplets of fluid, whereas the displayed section of channel 31 is filled by fluid running between sites of increased width.

A further advantage of the overhanging bank upper sections 33 is that they provide a shadow mask preventing vacuum deposition of electrode material near the banks. Thus, electrical insulation of electrodes situated between the banks 26–28 is ensured.

Alternatively, the locally widening banks can comprise only the convex photoresist section. If transverse banks are present, they can then be provided with upper portions with overhanging sections. Thus, it is also possible to print in a direction orthogonal to the banks with overhanging sections. The capillary effect is no longer present then, but less fluid ends up underneath overhanging bank sections, which can sometimes be desirable. Because the locally widening banks are still present, and printing still takes place along the channels defined by the locally widening banks, the essential advantage of wider deposition sites is preserved in this embodiment of the invention.

Figure 4:
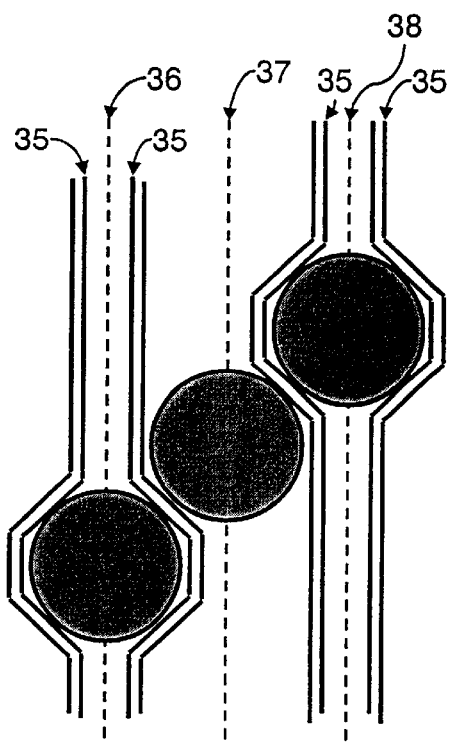
FIG. 4 shows a plan view of an alternative embodiment of the assembly according to the invention.
Figure 5:
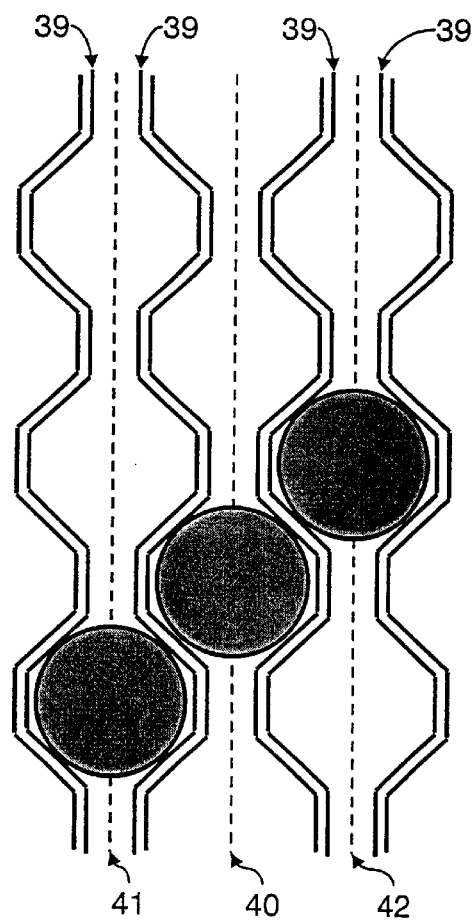
FIG. 5 shows a plan view of yet another alternative embodiment of the assembly according to the invention.

FIGS. 4–5 show two further embodiments of thin film assemblies according to the invention. In FIG. 4, banks 35 again define three channels 36–38 into which different fluids can be deposited. Moving along the channels 36–38 from the bottom of the picture to the top, it will be apparent that the widening of the central channel 37 at the deposition site is achieved at the expense only of the left channel 38, as is also the case in FIG. 2. Only one channel adjacent to the centre channel 37 narrows locally at a location parallel to a deposition site in the centre channel 37.

In contrast, in the embodiment of FIG. 5, banks 39 are offset at the same locations in the longitudinal direction. A first channel 40 widens at the expense of two neighbouring channels 41, 42. As both channels 41, 42 adjacent to the first channel 40 narrow locally at a location along the channels 41, 42 parallel to a deposition site in the first channel 40, straight banks, such as the banks 21, 24 shown in FIG. 2 do not occur in this embodiment. In contrast to the embodiment of FIG. 4, parallel straight sections of the different banks 39 are of equal length. Such a symmetrical arrangement has the advantage that the channel area, seen from the top, is substantially the same for each channel. In a multi-colour device, no colour will have a larger light emitting area.

It will be apparent to those skilled in the art that the invention is not limited to the above-described embodiments, which can be varied within the scope of the attached claims.

For example, it is not an essential aspect of the invention that the banks are of constant width.

Although the description has focussed on the deposition of a liquid, for example droplets, in the channels, it will be understood that the assembly of the invention can equally well be used for the deposition of the substance by vacuum deposition as disclosed in EP 0 732 868 B1.

In addition, although the description has focussed on thin film assemblies for organic electroluminescent display devices, it will be understood that they can equally well be used for other thin film optical devices, such as LCDs, wherein droplets of different dyes are deposited in the channels, or for plasma displays, wherein solutions of phosphor particles are deposited in the channels.

In summary, the invention relates to:

An assembly for a thin film optical device comprising a substrate (1; 25) and a plurality of elongated banks (4;

14, 21–24; 26–28; 35; 39), deposited on the substrate (1; 25) and spaced so as to form a plurality of channels (8–10, 15–17; 30, 31; 36–38; 40–42) for receiving a substance. At least one channel (15–17; 30, 31; 36–38; 40–42) widens locally at at least one position along that channel (15–17; 30, 31; 36–38; 40–42) to define a site for depositing a quantity (18–20) of the substance, a method of manufacturing an electroluminescent display device that is characterised by selecting such an assembly and depositing one or more quantities (18–20) of a substance comprising an organic electroluminescent material (3) only at deposition sites along a channel (15–17; 30, 31; 36–38; 40–42), and an organic electroluminescent display device that comprises such an assembly.

What is claimed is:

1. Assembly for a thin-film optical device, comprising a substrate and a plurality of elongated banks arranged on the substrate and spaced apart to form a plurality of channels for receiving a substance, wherein at least one channel widens locally at at least one position along that channel to define a site for depositing a quantity of the substance.

2. Assembly as claimed in claim 1, wherein each channel widens locally at a plurality of positions along that channel to define a plurality of sites for depositing quantities of the substance.

3. Assembly as claimed in claim 2, wherein parallel deposition sites of adjacent channels are staggered relative to each other.

4. Assembly as claimed in claim 1, wherein facing sides of the banks forming a channel have a section at least partially overhanging the channel.

5. Assembly as claimed in claim 1, comprising adjacent channels on either side of the channel that narrow locally at a location parallel to a deposition site in the channel.

6. Method of manufacturing an electroluminescent display device, including providing an assembly according to claim 1, and depositing one or more quantities of a substance comprising an organic electroluminescent material only at deposition sites along a channel.

7. Method as claimed in claim 6, wherein the quantities are deposited using an inkjet printing technique.

8. Method as claimed in claim 6, wherein the assembly comprises at least two adjacent channels with locally widened deposition sites, and substances comprising different electroluminescent material are deposited in adjacent channels.

9. Organic electroluminescent display device, comprising an assembly as claimed in claim 1.

10. Organic electroluminescent display device as claimed in claim 9, which further comprises at least one first electrically conducting structure embedded in or deposited on the substrate, and at least one further electrically conducting structure separated from the first structure by at least the electroluminescent material in such a manner as to form the anode and cathode of an organic Light Emitting Diode.

11. Display device as claimed in claim 10, wherein the first electrically conducting structure comprises first electrodes running substantially transversely to the channels, and a second electrically conducting structure comprises second electrodes running substantially parallel to the channels and forming pixels at points of overlap, wherein the second electrodes widen locally at one or more of the deposition sites, providing an increased pixel area.

12. The assembly of claim 2, wherein facing sides of the banks forming a channel have a section at least partially overhanging the channel.

13. The assembly of claim 3, wherein facing sides of the banks forming a channel have a section at least partially overhanging the channel.

14. The assembly of claim 2, including adjacent channels on either Bide of the channel that narrow locally at a location parallel to a deposition site in the channel.

15. The assembly of claim 3, including adjacent channels on either side of the channel that narrow locally at a location parallel to a deposition site in the channel.

16. The assembly of claim 4, including adjacent channels on either side of the channel that narrow locally at a location parallel to a deposition site in the channel.

17. Method of manufacturing an electroluminescent display device, including providing an assembly according to claim 2, and depositing one or more quantities of a substance comprising an organic electroluminescent material only at deposition sites along a channel.

18. Method of manufacturing an electroluminescent display device, including providing an assembly according to claim 3, and depositing one or more quantities of a substance comprising an organic electroluminescent material only at deposition sites along a channel.

19. Method of manufacturing an electroluminescent display device, including providing an assembly according to claim 4, and depositing one or more quantities of a substance comprising an organic electroluminescent material only at deposition sites along a channel.

20. Method of manufacturing an electroluminescent display device, including providing an assembly according to claim 5, and depositing one or more quantities of a substance comprising an organic electroluminescent material only at deposition sites along a channel.

* * * * *